(12) United States Patent
Kitano et al.

(10) Patent No.: US 7,486,377 B2
(45) Date of Patent: Feb. 3, 2009

(54) DEVELOPING METHOD AND DEVELOPING APPARATUS

(75) Inventors: Junichi Kitano, Koshi (JP); Osamu Miyahara, Koshi (JP); Shinya Wakamizu, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 86 days.

(21) Appl. No.: 10/578,611

(22) PCT Filed: Nov. 26, 2004

(86) PCT No.: PCT/JP2004/017544

§ 371 (c)(1),
(2), (4) Date: May 8, 2006

(87) PCT Pub. No.: WO2005/055294

PCT Pub. Date: Jun. 16, 2005

(65) Prior Publication Data

US 2007/0099129 A1 May 3, 2007

(30) Foreign Application Priority Data

Dec. 2, 2003 (JP) ............................. 2003-402873

(51) Int. Cl.
*G03B 27/52* (2006.01)
*G03D 5/00* (2006.01)

(52) U.S. Cl. ............................. 355/27; 396/611; 430/5; 430/30

(58) Field of Classification Search .................. 355/27; 396/611; 430/5, 30
See application file for complete search history.

(56) References Cited

FOREIGN PATENT DOCUMENTS

| JP | 62-31122 | 2/1987 |
|---|---|---|
| JP | 63-229715 | 9/1988 |
| JP | 6-275514 | 9/1994 |
| JP | 6-283414 | 10/1994 |
| JP | 7-20637 | 1/1995 |
| JP | 7-239558 | 9/1995 |
| JP | 2000-89477 | 3/2000 |

*Primary Examiner*—Della J. Rutledge
(74) *Attorney, Agent, or Firm*—Oblon, Spivak, McClelland, Maier & Neustadt, P.C.

(57) ABSTRACT

A developing method is used for subjecting a light-exposed resist film disposed on a wafer W to a developing process by a developing solution and a rinsing process by a rinsing liquid. In a state where the resist film on the wafer W is wet with the developing solution or rinsing liquid before a drying process is performed on the wafer W, a chemical liquid (curing chemical liquid), which contains a resist curing aid contributory to curing of a resist film remaining on the wafer W, is supplied onto a surface of the wafer W. Then, ultraviolet rays are radiated onto a surface of the wafer to cure a resist film remaining on the wafer W by a synergistic effect of the resist curing aid and the ultraviolet rays thus radiated, so as to prevent pattern fall.

5 Claims, 10 Drawing Sheets

DEVELOPING METHOD AND DEVELOPING APPARATUS

TECHNICAL FIELD

The present invention relates to a developing method and developing apparatus for a substrate, such as a semiconductor wafer or flat panel display, having a resist film subjected to a light exposure process.

BACKGROUND ART

In a photolithography process for manufacturing semiconductor devices, a resist pattern is formed on the surface of a semiconductor wafer, as follows. Specifically, a photo-resist is applied onto the surface of a semiconductor wafer to form a resist film. Then, a predetermined pattern is formed on the resist film by light exposure. The light-exposed portion or non light-exposed portion of the resist film is selectively dissolved by a developing solution. The developing solution is washed out by a rinsing liquid, such as purified water. Then, the semiconductor wafer is rotated at a high velocity to remove the rinsing liquid and dry the wafer.

In recent years, in order to increase the integration degree of semiconductor devices, the line width of resist patterns is increasingly miniaturized and the density of circuit patterns is becoming higher. Where the line width of resist patterns is smaller, a problem arises such that the patterns are deformed or bent (so called pattern fall) due to lack of the resist hardness.

The pattern fall of a resist pattern is caused by a force of the surface tension of a rinsing liquid. It is known that this force is generated when the liquid level of a rinsing liquid becomes lower than the top surface of a resist pattern, while the rinsing liquid is removed from a substrate and the resist pattern is dried. Accordingly, as long as the entirety of a resist pattern is immersed within a developing solution or rinsing liquid, no pattern fall is caused. In light of this, Jpn. Pat. Appln. KOKAI Publication No. 7-20637discloses a method for preventing pattern fall, as follows. Specifically, after a resist film is subjected to a developing process and a rinsing process, a rinsing liquid is solidified when the rinsing liquid is still left on the resist film. Then, the solidified rinsing liquid is sublimated.

However, this method cannot sufficiently prevent recent resist patterns having a smaller line width from causing pattern fall. Further, since solidification and sublimation of a rinsing liquid are required, the structure of a processing apparatus becomes complex.

DISCLOSURE OF INVENTION

The present invention was made in light of the problems described above, and has an object to provide a developing method that can prevent pattern fall of a resist pattern. Another object of the present invention is to provide a developing apparatus with a simple structure that can perform such a developing method.

According to a first aspect of the present invention, there is provided a developing method for subjecting a light-exposed resist film disposed on a substrate to a developing process by a developing solution and a rinsing process by a rinsing liquid, the method comprising:

supplying a chemical liquid, which contains a resist curing aid contributory to curing of a resist film remaining on the substrate, onto a surface of the substrate, in a state where the resist film on the substrate is wet with the developing solution or rinsing liquid; and then radiating predetermined high energy rays onto a surface of the substrate, thereby curing the resist film by a synergistic effect of the resist curing aid and the high energy rays thus radiated.

According to a second aspect of the present invention, there is provided a developing method for subjecting a light-exposed resist film disposed on a substrate to a developing process by a developing solution and a rinsing process by a rinsing liquid, the method comprising:

mixing the developing solution and a chemical liquid at a predetermined ratio to form a mixture liquid, and supplying the mixture liquid onto the substrate, wherein the chemical liquid contains a resist curing aid contributory to curing of a resist film remaining on the substrate after a developing reaction; and then radiating predetermined high energy rays onto a surface of the substrate, thereby concurrently performing a developing reaction of the resist film and curing of the resist film by a synergistic effect of the resist curing aid and the high energy rays.

According to a third aspect of the present invention, there is provided a developing method for subjecting a light-exposed resist film disposed on a substrate to a developing process by a developing solution and a rinsing process by a rinsing liquid, the method comprising:

during a rinsing process, mixing a chemical liquid and a rinsing liquid at a predetermined ratio to form a mixture liquid, and supplying the mixture liquid onto the substrate, wherein the chemical liquid contains a resist curing aid contributory to curing of a resist film remaining on the substrate after a developing reaction; then radiating predetermined high energy rays onto a surface of the substrate, thereby curing the resist film by a synergistic effect of the resist curing aid and the high energy rays; and then supplying only a rinsing liquid onto the substrate to wash out the mixture liquid from the substrate.

Further, the present invention is conceived to provide developing apparatuses to perform the developing methods described above. According to a fourth aspect of the present invention, there is provided a developing apparatus comprising:

a rotatable spin chuck configured to hold a substrate having a light-exposed resist film disposed thereon;

a developing solution nozzle configured to supply a predetermined developing solution for developing the resist film onto a surface of the substrate held by the spin chuck;

a rinsing nozzle configured to supply a rinsing liquid onto a surface of the substrate held by the spin chuck;

a chemical liquid nozzle configured to supply a chemical liquid onto a surface of the substrate held by the spin chuck, wherein the chemical liquid contains a resist curing aid contributory to curing of a resist film remaining on the substrate after a developing reaction;

a shifting mechanism configured to move the developing solution nozzle, the rinsing nozzle, and the chemical liquid nozzle relative to the substrate held by the spin chuck; and a light radiation mechanism configured to radiate light having a predetermined wavelength onto a surface of the substrate held by the spin chuck.

According to a fifth aspect of the present invention, there is provided a developing apparatus comprising:

a rotatable spin chuck configured to hold a substrate having a light-exposed resist film disposed thereon;

a developing solution/chemical liquid supply nozzle configured to mix a developing solution and a chemical liquid at a predetermined ratio to form a mixture liquid, and supply the mixture liquid onto a surface of the substrate held by the spin chuck, wherein the chemical liquid contains a resist curing aid contributory to curing of a resist film remaining on the substrate after a developing reaction;

a rinsing nozzle configured to supply a rinsing liquid onto a surface of the substrate held by the spin chuck;

a shifting mechanism configured to move the developing solution/chemical liquid nozzle and the rinsing nozzle relative to the substrate held by the spin chuck; and a light radiation mechanism configured to radiate light having a predetermined wavelength onto a surface of the substrate held by the spin chuck.

According to a sixth aspect of the present invention, there is provided a developing apparatus comprising:

a rotatable spin chuck configured to hold a substrate having a light-exposed resist film disposed thereon;

a developing solution nozzle configured to supply a predetermined developing solution for developing the resist film onto a surface of the substrate held by the spin chuck;

a rinsing liquid/chemical liquid supply nozzle configured to mix a chemical liquid and a rinsing liquid at a predetermined ratio to form a mixture liquid, and supply the mixture liquid onto a surface of the substrate held by the spin chuck, wherein the chemical liquid contains a resist curing aid contributory to curing of a resist film remaining on the substrate after a developing reaction;

a shifting mechanism configured to move the developing solution nozzle and the rinsing liquid/chemical liquid nozzle relative to the substrate held by the spin chuck; and a light radiation mechanism configured to radiate light having a predetermined wavelength onto a surface of the substrate held by the spin chuck.

According to the present invention, a synergistic effect of the resist curing aid and the high energy rays is applied to the resist film wet with the developing solution or rinsing liquid, so that the hardness of the resist film is sufficiently increased. Consequently, it is possible to prevent pattern fall from occurring when the substrate is rotated at a high velocity to spread and remove the rinsing liquid, as in the conventional technique. Further, according to the present invention, it is possible to simplify the structure of the developing apparatus, shorten the process time, and reduce the amount of consumption of the chemical liquid.

BEST MODE FOR CARRYING OUT THE INVENTION

Figure 1:
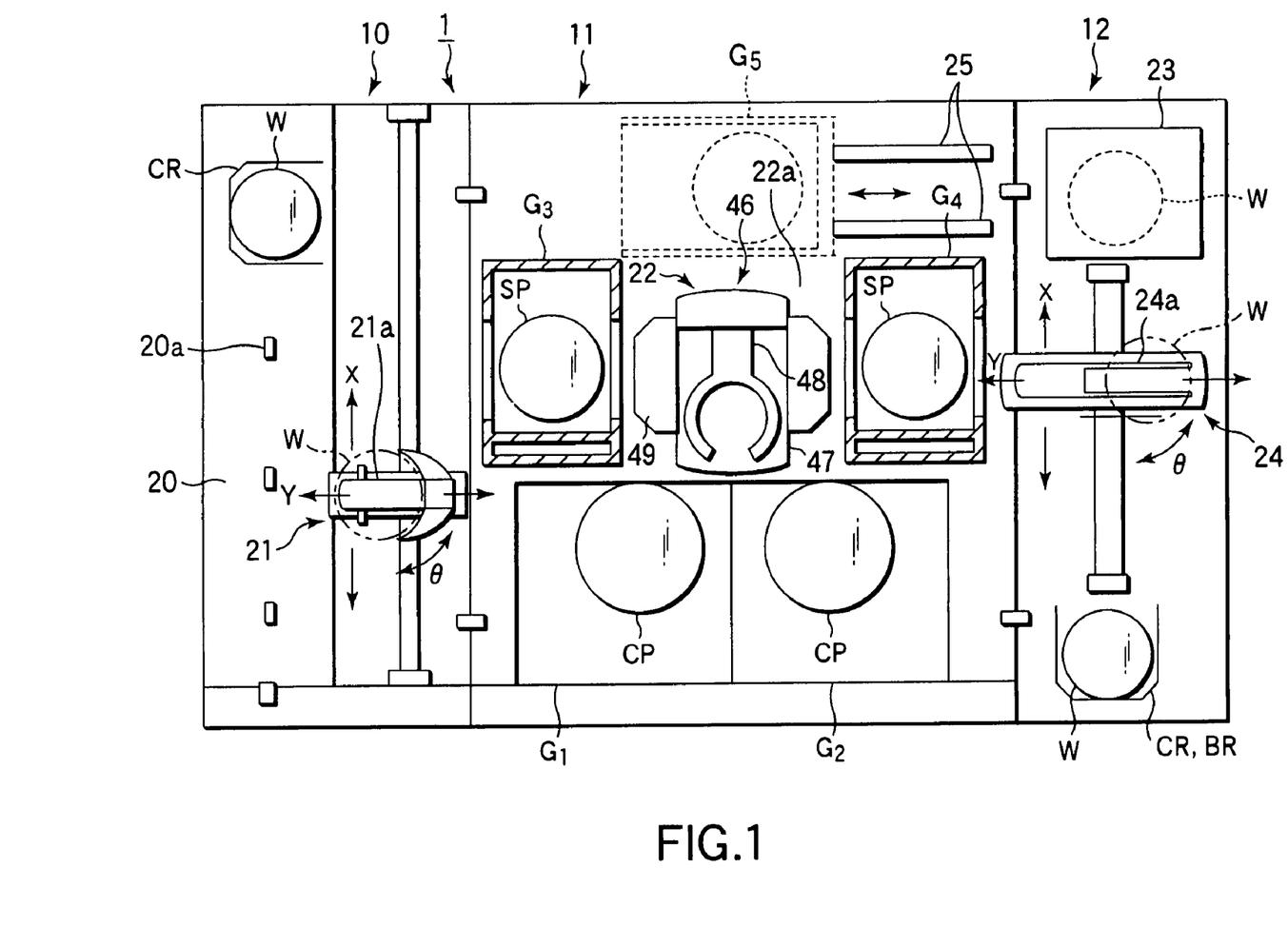
[FIG. 1] This is a plan view schematically showing a resist coating and developing system according to an embodiment.
Figure 2:
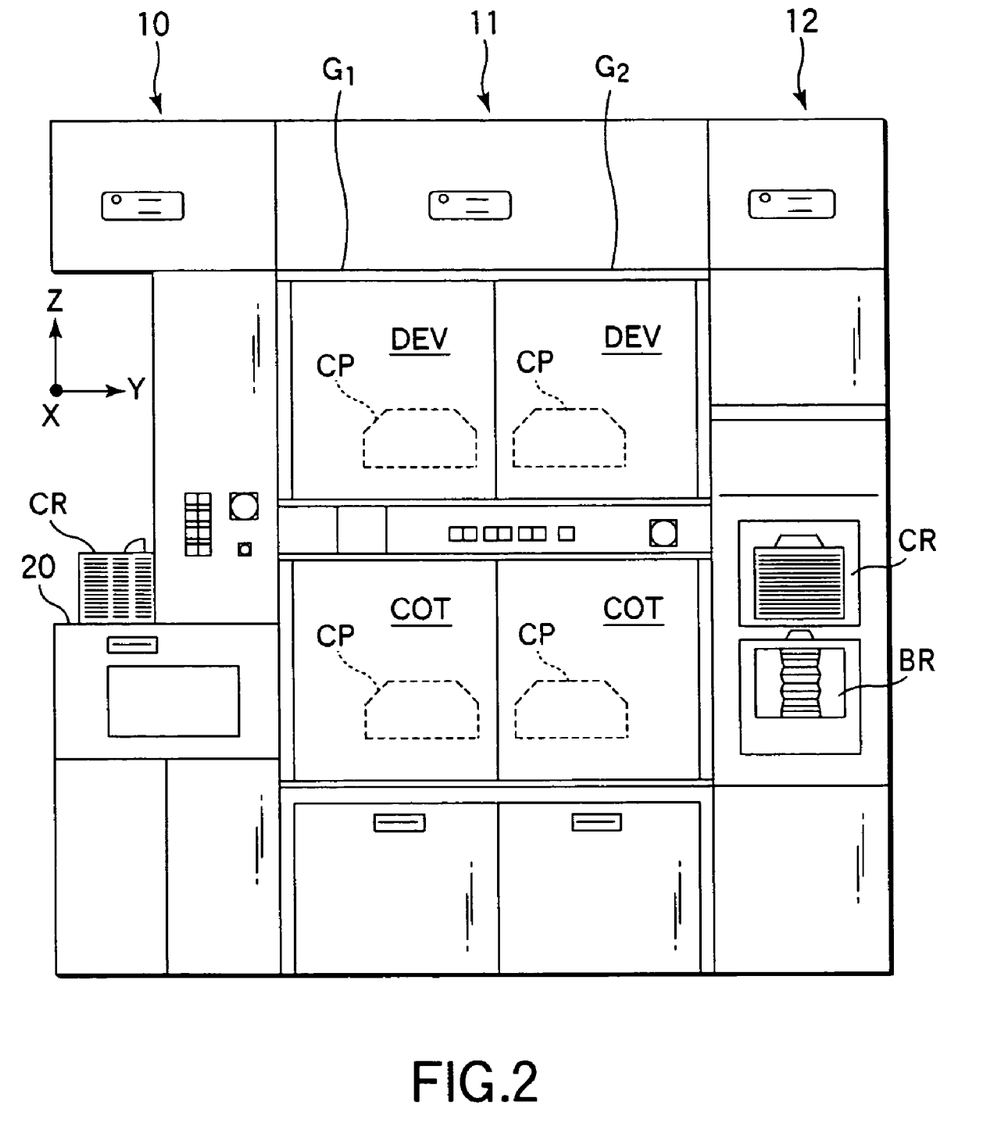
[FIG. 2] This is a front view schematically showing the resist coating and developing system according to an embodiment.
Figure 3:
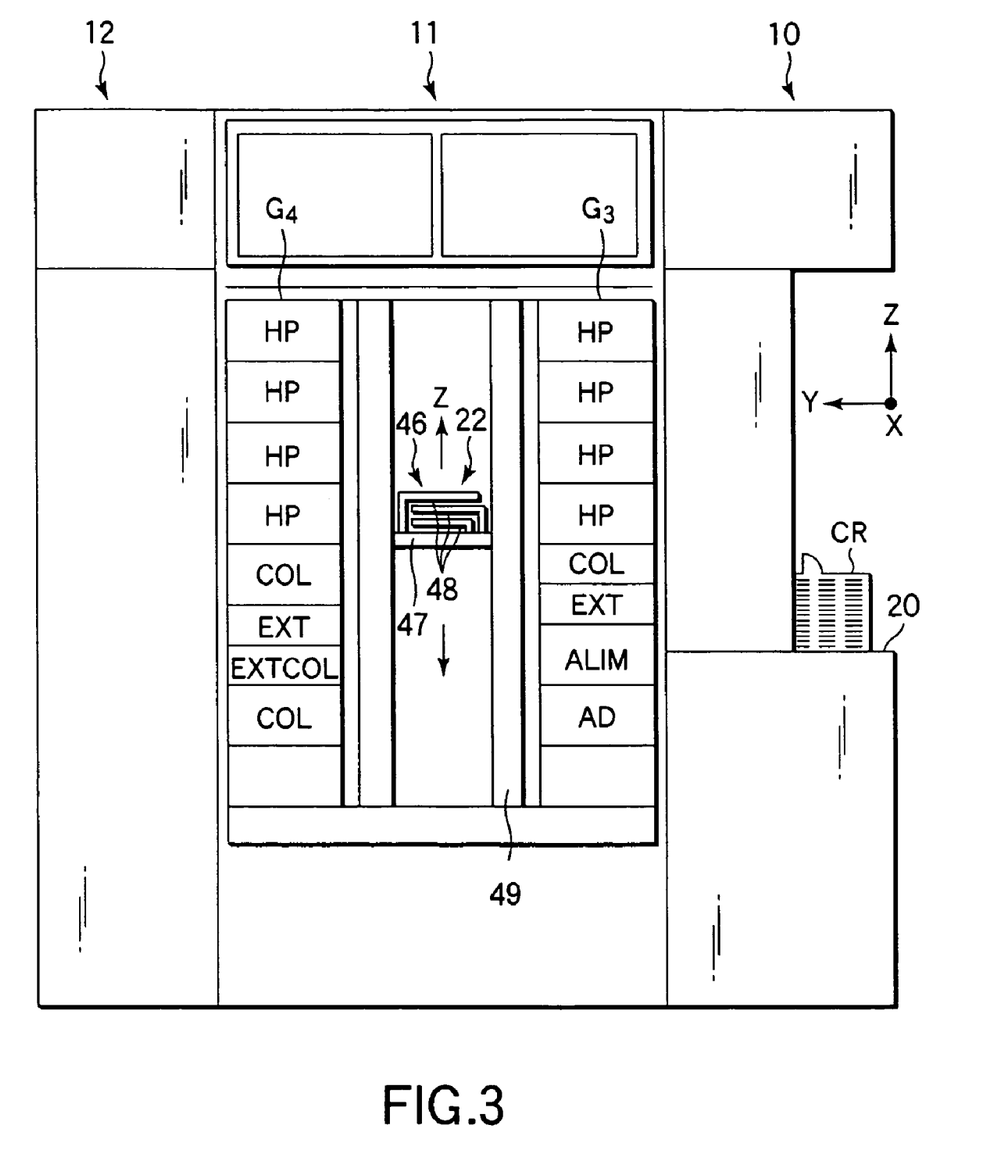
[FIG. 3] This is a back view schematically showing the resist coating and developing system according to an embodiment.

Embodiments of the present invention will now be described with reference to the accompanying drawings. In the embodiments, an explanation will be given of a developing method using a resist coating and developing system that performs a series of processes from resist coating on a semiconductor wafer (wafer) to developing for the same FIG. 1 is a plan view schematically showing a resist coating and developing system, FIG. 2 is a front view thereof, and FIG. 3 is a back view thereof. This resist coating and developing system 1 comprises a cassette station 10 used as a transfer station; a process station 11 including a plurality of processing units; and an interface section 12 configured to transfer wafer W to and from a light exposure apparatus (not shown) disposed adjacent to the process station 11.

The cassette station 10 is used to transfer wafer cassettes CR, each of which stores a plurality of, e.g., 25, target objects or wafers W, from other systems to this resist coating and developing system 1, and to transfer the wafer cassettes CR from this resist coating and developing system 1 to other systems. The cassette station 10 is further configured to transfer wafers W between the wafer cassettes CR and process station 11.

As shown in FIG. 1, the cassette station 10 includes a cassette table 20 on which a plurality of (four in this embodiment) positioning projections 20a are arrayed in an X direction in this figure. The wafer cassettes CR are placed in a row at positions set by the projections 20a while their wafer port openings are directed toward the process station 11. In each of the wafer cassettes CR, wafers W are stacked at regular intervals in the vertical direction (Z direction).

The cassette station 10 includes a wafer transfer mechanism 21 between the cassette table 20 and process station 11, which is movable in the array direction of the wafer cassettes CR (the X direction). This wafer transfer mechanism 21 includes a wafer transfer pick 21a, which is slidable in an X-Y plane shown in FIG. 1, movable up and down in the Z direction (the direction perpendicular to the sheet surface of FIG. 1), and rotatable in a θ direction (rotational direction on the X-Y plane). With this arrangement, the wafer transfer pick 21a can selectively access any one of the wafers W in the wafer cassettes CR placed on the cassette table 20. Further, the wafer transfer pick 21a can access an alignment unit (ALIM) and an extension unit (EXT) that belongs to a third processing section G3 in the process station 11, as described later.

The process station 11 includes a plurality of processing units for subjecting wafers W to coating and developing in a series of steps. The processing units are stacked one on the other and each of the processing units is configured to process wafers W one by one. As shown in FIG. 1, the process station 11 has a wafer transfer passage 22a at the center, in which a main wafer transfer mechanism 22 is disposed, while all the processing units are set up around the wafer transfer passage 22a. The processing units are divided to belong to a plurality of processing sections, each of which includes a plurality of processing units stacked in the vertical direction (Z direction).

As shown in FIG. 3, the main wafer transfer mechanism 22 includes a wafer transfer unit 46 disposed inside a cylindrical support 49 and configured to be moved up and down in the vertical direction (Z direction). The cylindrical support 49 is rotatable integrally with the wafer transfer unit 46 by a rotational driving force given from a motor (not shown). The wafer transfer unit 46 includes a transfer base 47 and a plurality of wafer transfer arms 4 movable back and forth on the transfer base 47. The wafer transfer arms 48 are used to transfer wafers W between the processing units.

As shown in FIG. 1, in the resist coating and developing system 1, four processing sections G1, G2, G3, and G4 are actually disposed around the wafer transfer passage 22a, and a fifth processing section G5 may be disposed, as needed. Of them, the first and second processing sections G1 and G2 are located side by side on the front side of the resist coating and developing system 1 (the near side in FIG. 1). The third processing section G3 is located adjacent to the cassette station 10, while the fourth processing section G4 is located adjacent to the interface section 12. The fifth processing section G5 can be located on the rear side.

The first processing section G1 includes a resist. coating unit (COT) and a developing unit (DEV) for developing resist patterns, which are stacked in this order to form two tiers. These two processing units are of the spinner type, in which a wafer W is mounted on a spin chuck (not shown) inside a coater cup (CP) to perform a predetermined process. The second processing section G2 also includes a resist coating unit (COT) and a developing unit (DEV) stacked in this order to form two tiers, which are formed of processing units of the spinner type, as in the first processing section G1.

As shown in FIG. 3, the third processing section G3 includes processing units stacked one on the other at a plurality of levels. These two processing units are of the oven type, in which a wafer W is mounted on a worktable SP to perform a predetermined process. Specifically, there are eight units stacked to form eight tiers in the following order: an adhesion unit (AD) for performing a so-called hydrophobization process to improve resist fixation; an alignment unit (ALIM) for performing alignment; an extension unit (EXT) for transferring wafers W; a cooling unit (COL) for performing a cooling process; and four hot plate units (HP) for performing a heating process on wafers W before and after the light exposure process and after the developing process. In place of the alignment unit (ALIM), a cooling unit (COL) with an alignment function may be disposed.

The fourth processing section G4 also includes processing units of the oven type stacked one on the other at a plurality of levels. Specifically, there are eight units stacked to form eight tiers in the following order: a cooling unit (COL); an extension and cooling unit (EXTCOL) having a cooling plate and configured to transfer wafers; an extension unit (EXT); a cooling unit (COL); and four hot plate units (HP).

Where the fifth processing section G5 is disposed on the rear side of the main wafer transfer mechanism 22, the fifth processing section G5 is arranged to be movable laterally relative to the main wafer transfer mechanism 22 along a guide rail 25. Accordingly, even where the fifth processing section G5 is disposed, a space is formed by sliding the fifth processing section G5 along the guide rail 25, so that a maintenance operation can be easily performed on the main wafer transfer mechanism 22 from behind.

The interface section 12 has the same length in the depth direction (X direction) as the depth length of the process station 11. As shown in FIGS. 1 and 2, the interface section 12 includes a buffer cassette BR of the stationary type and a pick up cassette CR of the portable type stacked to form two tiers on the front side. The interface section 12 further includes a periphery light exposure unit 23 disposed on the rear side, and a wafer transfer mechanism 24 movable in the X direction disposed at the center. The wafer transfer mechanism 24 includes a wafer transfer arm 24a, which is slidable in the X-Y plane, movable up and down in the Z direction, and rotatable in the θ direction. With this arrangement, the wafer transfer arm 24a can selectively access any one of the cassettes CR and BR, the periphery light exposure unit 23, the extension unit (EXT) in the fourth processing section G4 of the process station 11, and a wafer transfer table (not shown) of the adjacent light exposure apparatus.

According to the resist coating and developing system 1 described above, at first, in the cassette station 10, the wafer transfer pick 21a of the wafer transfer mechanism 21 accesses a wafer cassette CR on the cassette table 20, which stores unprocessed wafers. Then, one wafer W is taken out therefrom by the wafer transfer pick 21a and transferred into the extension unit (EXT) in the third processing section G3.

Then, this wafer W is transferred by the wafer transfer unit 46 of the main wafer transfer mechanism 22 from the extension unit (EXT) into the alignment unit (ALIM) in the third processing section G3, in which the wafer W is subjected to alignment. Then, the wafer W is transferred into the adhesion processing unit (AD), in which the wafer is subjected to a hydrophobization process (HMDS process) to improve resist fixation. Since this process is accompanied with heating, the wafer W is then transferred by the wafer transfer unit 46 into the cooling unit (COL), in which the wafer W is cooled.

There may be a case where a wafer W is directly transferred into the resist coating unit (COT) without the HMDS process performed thereon, depending on the type of resist applied on the wafer W. This type of resist includes, for example, polyimide resists.

The wafer W that has been processed in the adhesion processing unit (AD) and cooled in the cooling unit (COL) or that has skipped the process in the adhesion processing unit (AD) is then transferred by the wafer transfer unit 46 into the resist coating unit (COT), in which a coating film is formed on the wafer W by resist coating. After the coating process is finished, the wafer W is subjected to a pre-baking process in one of the hot plate units (HP) and is then cooled in one of the cooling units (COL), in the third or fourth processing section G3 or G4.

After the wafer W is cooled, the wafer W is transferred into the alignment unit (ALIM) in the third processing section G3, in which the wafer W is subjected to alignment. Then, the wafer W is transferred through the extension unit (EXT) in the fourth processing section G4 to the interface section 12.

In the interface section 12, the wafer W is subjected to periphery light exposure in the periphery light exposure unit 23 to remove unnecessary resist. Then, the wafer W is transferred into the light exposure apparatus (not shown) disposed adjacent to the interface section 12, in which the resist film on the wafer W is subjected to a light exposure process in accordance with a predetermined pattern.

After the light exposure process, the wafer W is returned to the interface section 12, and is transferred by the wafer transfer mechanism 24 into the extension unit (EXT) in the fourth processing section G4. Then, the wafer W is transferred by the wafer transfer unit 46 into one of the hot plate units (HP), in which the wafer W is subjected to a post-exposure baking process. Then, the wafer W is transferred into the cooling unit (COL), in which the wafer W is cooled.

Thereafter, the wafer W is transferred into the developing unit (DEV), in which the wafer W is subjected to a developing process for the light-exposed pattern. After the developing process, in general, the wafer W is transferred into one of the hot plate units (HP), in which the wafer W is subjected to a post-baking process, and is then cooled in the cooling unit (COL). After such a series of processes is finished, the wafer W is returned through the extension unit (EXT) in the third processing section G3 to the cassette station 10. Then, the wafer W is stored in one of the wafer cassettes CR.

Figure 4:
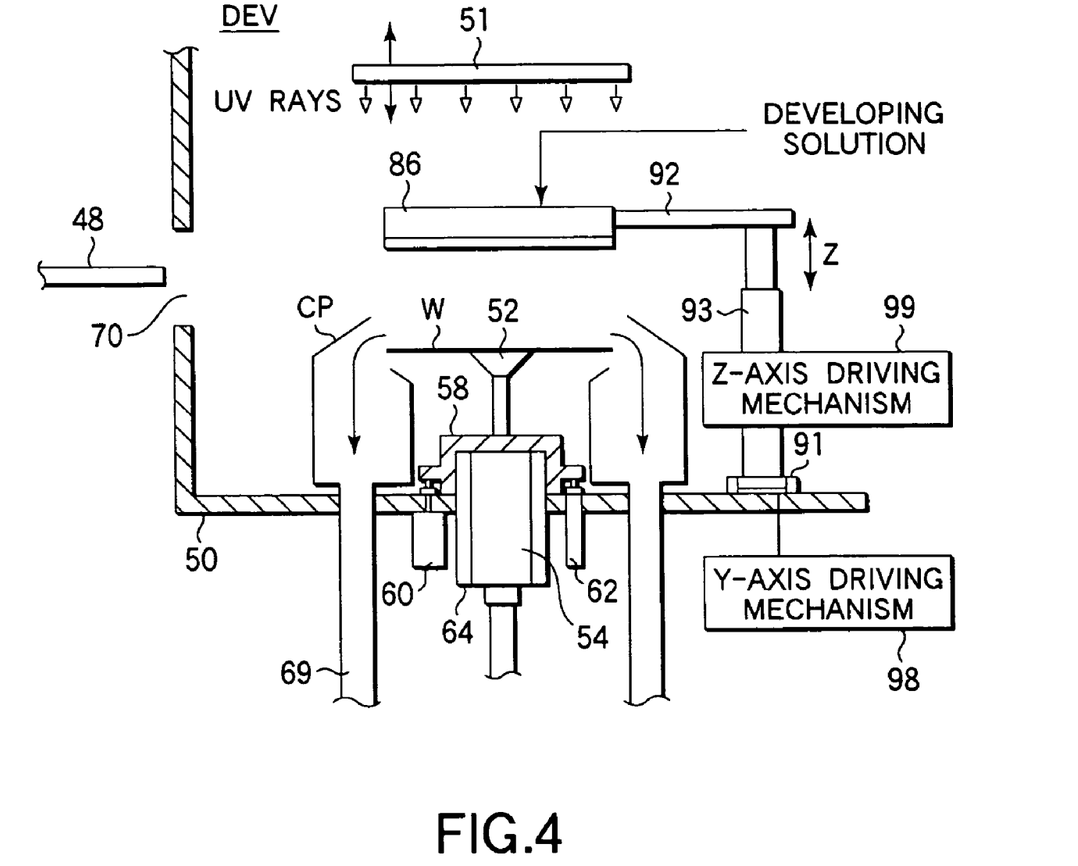
[FIG. 4] This is a sectional view schematically showing a developing unit (DEV) according to an embodiment.
Figure 5:
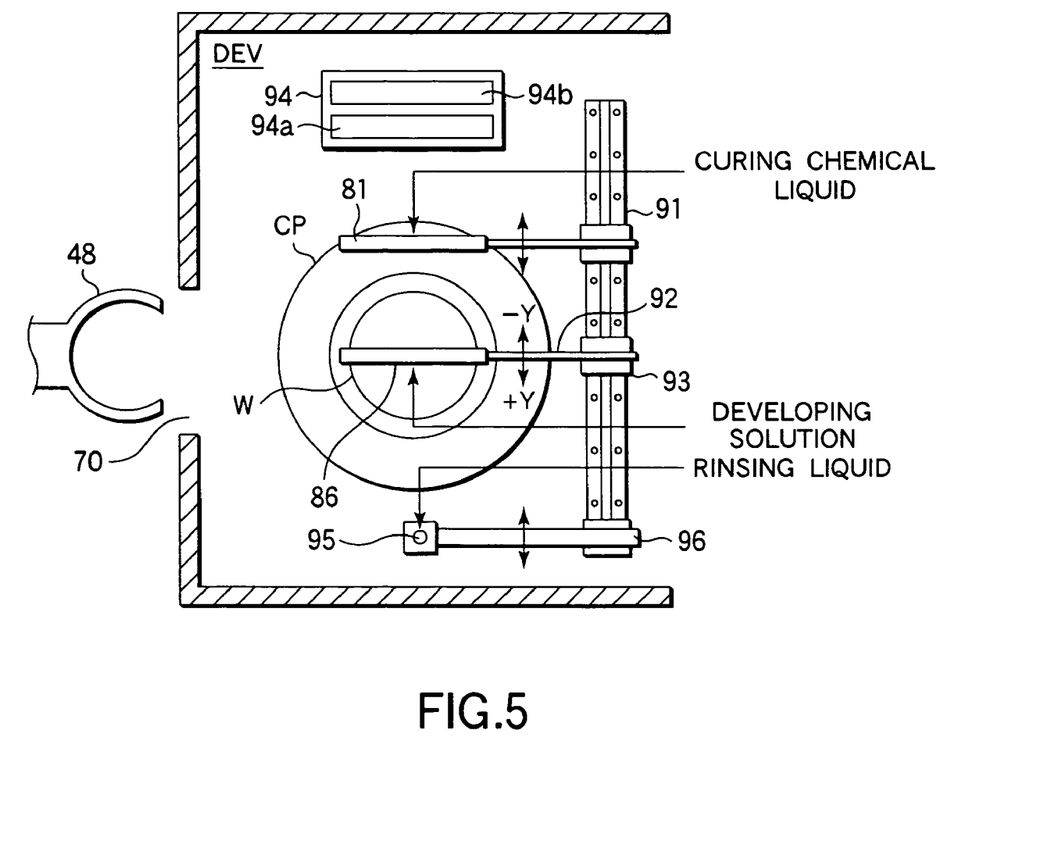
[FIG. 5] This is a plan view schematically showing the developing unit (DEV) according to an embodiment.

Then, a detailed explanation will be given of the developing unit (DEV) described above. FIG. 4 is a sectional view schematically showing the structure of the developing unit (DEV), and FIG. 5 is a plan view thereof. The developing unit (DEV) includes an annular coater cup (CP) disposed at the center, which surrounds a spin chuck 52. The spin chuck 52 is rotated by a driving motor 54 along with a wafer W fixed and held thereon by vacuum attraction. The driving motor 54 is movable up and down through an opening formed in a unit bottom plate 50. For example, the driving motor 54 is connected to vertical driving means 60, which is formed of, e.g., an air cylinder, and vertical guiding means 62, through a cap-like flange member 58 made of aluminum. The driving motor 54 is provided with a cylindrical cooling jacket 64 made of, e.g., stainless steel (SUS), disposed on the side. The flange member 58 is attached to cover the upper half of the cooling jacket 64.

When a developing solution is applied, the bottom of the flange member 58 is brought into close contact with the unit bottom plate 50 around the opening of the unit bottom plate 50, so that the inside of the unit is sealed. When the wafer W is transferred between the spin chuck 52 and main wafer transfer mechanism 22, the driving motor 54 is moved up along with the spin chuck 52 by the vertical driving means 60, so that the bottom of the flange member 58 is separated from the unit bottom plate 50. The casing of the developing unit (DEV) has a window 70 through which a wafer transfer arm 48 comes into the unit.

Figure 6:
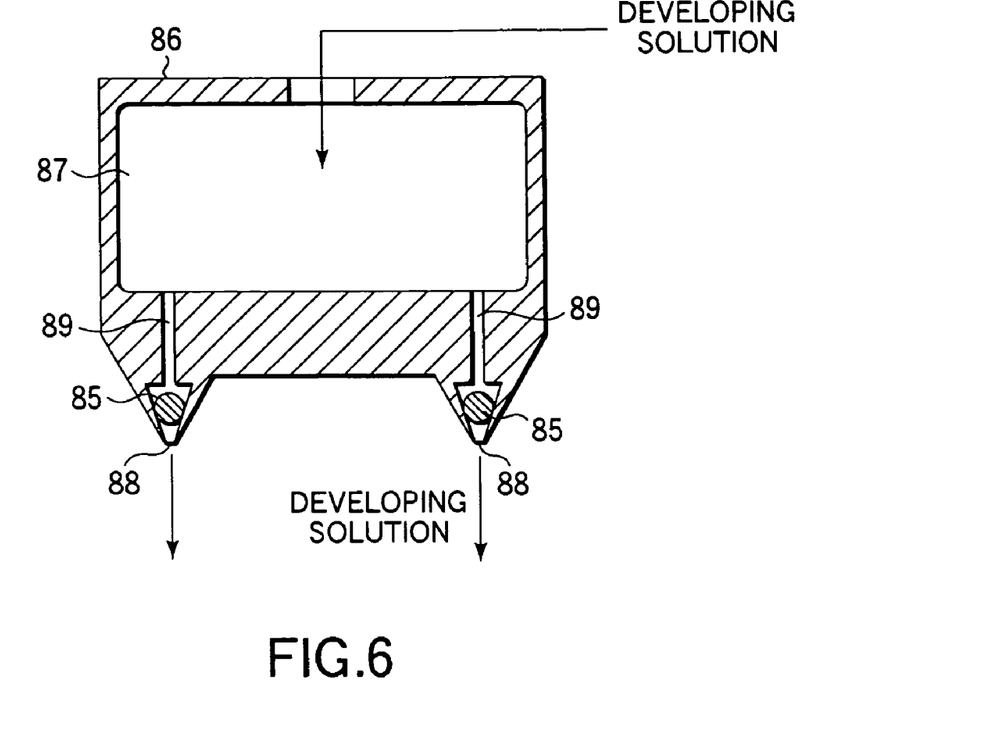
[FIG. 6] This is a sectional view schematically showing a sectional shape of a developing solution nozzle, perpendicularly to the longitudinal direction thereof.

A developing solution nozzle 86 for supplying a developing solution onto the surface of the wafer W has an elongated shape and is disposed such that the longitudinal direction (X direction) of the elongated shape is horizontal. FIG. 6 is a sectional view schematically showing a sectional shape of the developing solution nozzle 86, perpendicularly to the longitudinal direction thereof. The developing solution nozzle 86 includes a developing solution cell 87 extending in the X direction, which can store the developing solution supplied from a developing solution supply section (not shown). The developing solution nozzle 86 further includes two communication channels 89, each of which is connected to the developing solution cell 87 and has a slit-like discharge port 88 at the end to discharge the developing solution.

The developing solution supplied into the developing solution cell 87 is sent through each of the communication channels 89 and delivered essentially as a strip from each of the slit-like discharge ports 88 at the end of the communication channels 89. Near the slit-like discharge port 88, in each of the communication channels 89, a buffer rod 85 (such as quartz rod or porous body) is disposed. This buffer rod 85 causes the pressure of the developing solution delivered from the slit-like discharge port 88 to be uniform in the longitudinal direction of the developing solution nozzle 86. Further, the buffer rod 85 can prevent the developing solution from leaking from the slit-like discharge port 88.

The developing solution nozzle 86 is detachably attached to the distal end of a nozzle scan arm 92. The nozzle scan arm 92 is attached to the upper end of a vertical support member 93. The vertical support member 93 is horizontally movable in the Y direction by a Y-axis driving mechanism 98 along a guide rail 91 extending in one direction (the Y direction) on the unit bottom plate 50. The vertical support member 93 further includes a Z-axis driving mechanism 99, and thus the nozzle scan arm 92 is movable up and down in the Z direction by the Z-axis driving mechanism 99. Consequently, the developing solution nozzle 86 is movable in the Y direction and Z direction.

As shown in FIG. 5, the developing unit (DEV) further includes a chemical liquid nozzle 81, which has an elongated shape similar to the developing solution nozzle 86 and is disposed in parallel to the developing solution nozzle 86. The chemical liquid nozzle 81 is movable in the Y direction and Z direction, as in the developing solution nozzle 86. FIG. 4 does not show the chemical liquid nozzle 81, because it overlaps with developing solution nozzle 86 in the direction perpendicular to the sheet surface of FIG. 4.

A chemical liquid is supplied from a chemical liquid supply section (not shown) to the chemical liquid nozzle 81 and discharged therefrom essentially as a strip onto the wafer W. After a resist film formed on the wafer W is processed by the developing solution, a patterned resist film remains on the wafer W (which will be referred to as "remaining resist pattern"). The chemical liquid contains a resist curing aid contributory to curing of the remaining resist pattern. The term "resist curing aid" designates a substance that has one of the following functions: the function of directly reacting with the remaining resist pattern to cure the remaining resist pattern under the presence of predetermined high energy rays; the catalytic function of promoting curing of the remaining resist pattern by predetermined high energy rays; and the function of reacting with the remaining resist pattern to form crosslinking bonds in the remaining resist pattern and thereby cure the remaining resist pattern In other words, the resist curing aid cures the remaining resist pattern by a synergistic effect with high energy ray irradiation.

The resist curing aid may be one that has the function of curing remaining resist pattern without high energy ray irradiation. However, it should be noted that the resist curing aid used in this embodiment is limited to one that does not render a curing function sufficient to prevent pattern fall of the remaining resist pattern without high energy ray irradiation.

The developing solution nozzle 86 is retreated to a standby portion 94 (see FIG. 5) after it applies the developing solution onto the wafer W. The nozzle standby portion 94 includes a first nozzle bath 94a for cleaning the slit-like discharge port 88 of the developing solution nozzle 86, and a second nozzle bath 94b for cleaning the slit-like discharge port of the chemical liquid nozzle 81.

The developing unit (DEV) further includes a rinsing nozzle 95 for delivering a rinsing liquid onto the wafer W. FIG. 4 does not show the rinsing nozzle 95. The rinsing liquid is supplied from a rinsing liquid supply section (not shown) to the rinsing nozzle 95, and sprayed from the rinsing nozzle 95 onto the surface of the wafer W while being expanded in a conical shape. The rinsing nozzle 95 is attached to the distal end of a nozzle scan arm 96, which is movable in the Y direction along the guide rail 91 and also movable up and down in the Z direction by an elevating mechanism (not shown).

Figure 7:
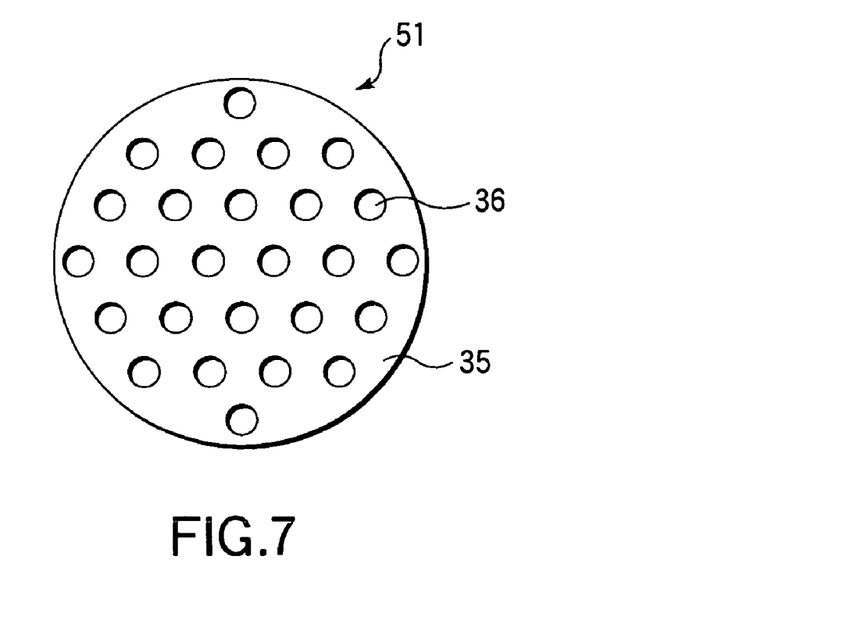
[FIG. 7] This is a plan view schematically showing the structure of a light radiation device.

The developing unit (DEV) is provided with a light radiation device 51 at an upper position, which is movable up and down by an elevating mechanism (not shown). FIG. 7 is a plan view schematically showing the structure of the light radiation device 51. The light radiation device 51 includes a circular plate container 35 having a size almost the same as the wafer W, and a plurality of light sources or lamps 36 arrayed at predetermined intervals lengthwise and breadthwise within the container 35, so as to uniformly irradiate the entire surface of the wafer W with light energy. For example, the lamps 36 are formed of ultraviolet lamps.

Next, an explanation will be given of a developing method performed on a wafer W in the developing unit (DEV), focusing on a curing process of the remaining resist pattern. When a wafer W is processed in the developing unit (DEV), the wafer W is supplied with the curing chemical liquid always in a state where the light-exposed resist film on the wafer W is wet with the developing solution or rinsing liquid, and then the surface of the wafer W is irradiated with ultraviolet rays from the light radiation device 51, used as high energy rays. Consequently, the resist curing aid and ultraviolet rays thus applied generate a synergistic effect that is utilized for curing the remaining resist pattern.

After the resist film is developed and the remaining resist pattern is cured, the developing solution and curing chemical liquid are washed out from the surface of the wafer W by the rinsing liquid. At the end, the wafer W is rotated at a predetermined rotational velocity and thereby dried. Where it is necessary to form a puddle of the developing solution or the like on the wafer, the wafer W is stopped or rotated at a low velocity. Where it is unnecessary to form a puddle, the wafer W is preferably rotated at a rotational velocity of 4,000 rpm or less during a predetermined process. With this operation, the process time can be shortened, and the amount of consumption of the curing chemical liquid and rinsing liquid can be reduced.

At first, an explanation will be given of a developing method where the resist curing aid is water soluble, and the curing chemical liquid is a water solution.

In a first processing method, immediately after the developing solution starts being supplied from the developing solution nozzle 86 onto a wafer W, the curing chemical liquid is supplied from the chemical liquid nozzle 81 onto that portion of the wafer W which has been supplied with the developing solution. Further, ultraviolet rays are radiated from the light radiation device 51 onto the surface of the wafer W. In this first method, a developing reaction of the resist film by the developing solution and a curing process of the remaining resist pattern by the curing chemical liquid are caused to proceed almost simultaneously. Accordingly, the curing chemical liquid needs to contain a resist curing aid that has a property of preferentially acting only on the remaining resist pattern.

Further, in the first processing method, when the developing solution is applied, the following method is preferably used. Specifically, the developing solution nozzle 86 is moved for scanning from a side where the chemical liquid nozzle 81 is disposed to a side where the rinsing nozzle 95 is disposed (i.e., in the +Y direction), while the developing solution is delivered as a strip from the developing solution nozzle 86. Further, the chemical liquid nozzle 81 is also moved for scanning in chase of developing solution nozzle 86, while the curing chemical liquid is delivered from the chemical liquid nozzle 81. Such nozzle scanning may be repeated a plurality of times.

During the process in the developing unit (DEV), it is preferable due to the structure thereof that the developing solution nozzle 86 and chemical liquid nozzle 81 are retreated out of the coater cup (CP) and the light radiation device 51 is moved down to a predetermined height, when the light radiation device 51 is used to irradiate the surface of the wafer W with ultraviolet rays. However, while the developing solution nozzle 86 and chemical liquid nozzle 81 are moved for scanning or the wafer W is rotated, it is acceptable that the developing solution nozzle 86 and chemical liquid nozzle 81 are present between the wafer W and light radiation device 51.

As described above, the light radiation device 51 is configured to uniformly irradiate the entire surface of the wafer W with ultraviolet rays. Accordingly, it is more preferable that the ultraviolet ray irradiation is performed in a sate where the entire surface of the wafer W has been supplied with the curing chemical liquid. This manner of ultraviolet ray irradiation is also employed in second to fourth processing methods described later.

In a second processing method, the developing solution is supplied from the developing solution nozzle 86 onto a wafer W to form a puddle of the developing solution on the wafer W. Then, the curing chemical liquid is supplied from the chemical liquid nozzle 81 onto this puddle of the developing solution. Then, ultraviolet rays are radiated from the light radiation device 51 onto the portion having the curing chemical liquid thus supplied on the surface of the wafer W. The curing chemical liquid may be supplied while the development of the resist film by the developing solution is making progress, or after the development is completely finished. Where the curing chemical liquid is supplied after the development of the resist film by the developing solution is completely finished, the resist curing aid is not required to have selectivity between the light-exposed portion and non light-exposed portion of the resist film.

In a third processing method, a developing reaction of the resist film is first finished by the developing solution, and then the rinsing liquid starts being supplied from the rinsing nozzle 95 onto the wafer W. Immediately thereafter, the curing chemical liquid is supplied from the chemical liquid nozzle 81 onto that portion of the wafer W which has been supplied with the rinsing liquid. Then, ultraviolet rays are radiated from the light radiation device 51 onto the surface of the wafer W. The ultraviolet ray irradiation may be performed in a state where a puddle of the curing chemical liquid is formed on the surface of the wafer W by stopping the wafer W. Alternatively, the ultraviolet ray irradiation may be performed while the wafer W is rotated and the curing chemical liquid is discharged from the chemical liquid nozzle 81 onto the wafer W.

In a fourth processing method, a developing reaction of the resist film is first finished by the developing solution, and then a rinsing process by the rinsing liquid is finished. Thereafter, in a state where the resist film on the wafer W is wet with the rinsing liquid, the curing chemical liquid is supplied from the chemical liquid nozzle 81 onto the wafer W. Then, ultraviolet rays are radiated from the light radiation device 51 onto the surface of the wafer W. Also in this method, the ultraviolet ray irradiation may be performed in a state where a puddle of the curing chemical liquid is formed on the surface of the wafer W by stopping the wafer W. Alternatively, the ultraviolet ray irradiation may be performed while the wafer W is rotated and the curing chemical liquid is discharged from the chemical liquid nozzle 81 onto the wafer W.

In the first to fourth processing methods described above, the curing chemical liquid may preferably contain a surfactant as an additive. Further, the rinsing liquid, which is purified water, may preferably contain, as an additive, any one of a surfactant, a chemical liquid having a large contact angle relative to the resist film, and a chemical liquid having a contact angle equivalent to purified water and a small surface tension. In this case, the surface tension of the curing chemical liquid and rinsing liquid becomes lower. Consequently, for example, when the wafer W is rotated at a high velocity to spread and remove these liquids from the surface of the wafer W, it is possible to prevent pattern fall from occurring.

Next, an explanation will be given of a case where the resist curing aid is hydrophobic, and the curing chemical liquid is a hydrophobic organic solvent. In general, the developing solution is based on water, and the rinsing liquid is purified water. In this case, it is difficult for the curing chemical liquid to be mixed with the developing solution and rinsing liquid. Accordingly, there may be a preferable method, in which the curing chemical liquid is supplied from the chemical liquid nozzle 81 onto a wafer W to replace the developing solution or rinsing liquid on the wafer W with the curing chemical liquid. Then, ultraviolet rays are radiated from the light radiation device 51 onto the surface of the wafer W. Alternatively, instead of replacing the developing solution or rinsing liquid with the curing chemical liquid, the developing solution or rinsing liquid may be replaced with a water soluble organic solvent, which is then replaced with the curing chemical liquid.

Figure 8:
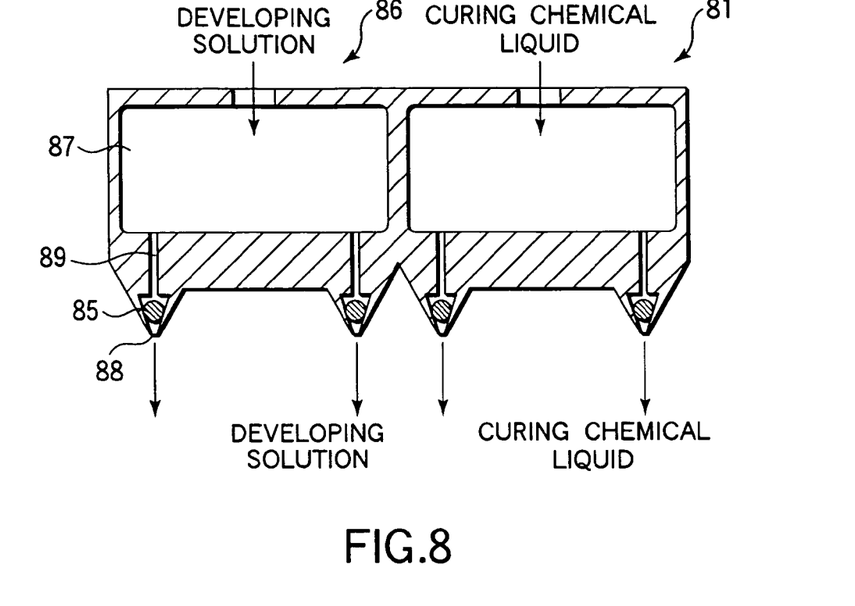
[FIG. 8] This is a sectional view showing a nozzle structure in which a developing solution nozzle is integrated with a chemical liquid nozzle.

As shown in the sectional view of FIG. 8, the developing unit (DEV) described above may be arranged such that the developing solution nozzle 86 is integrated with the chemical liquid nozzle 81, so that they are simultaneously moved for scanning. Further, the rinsing nozzle 95 may be formed of an elongated structure as in the developing solution nozzle 86 (or chemical liquid nozzle 81). A rinsing nozzle of such an elongated structure may be integrated with the chemical liquid nozzle 81. Each of the developing solution nozzle 86 and chemical liquid nozzle 81 has two slit-like discharge ports 88, but each nozzle may have only one slit-like discharge port.

Figure 9:
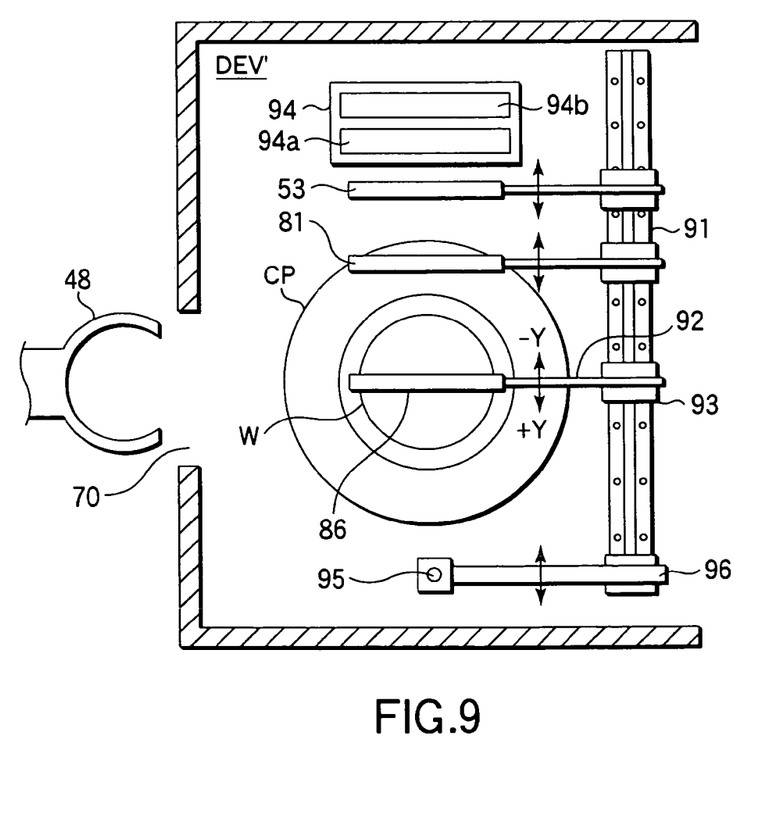
[FIG. 9] This is a plan view schematically showing another developing unit (DEV)'.
Figure 10:
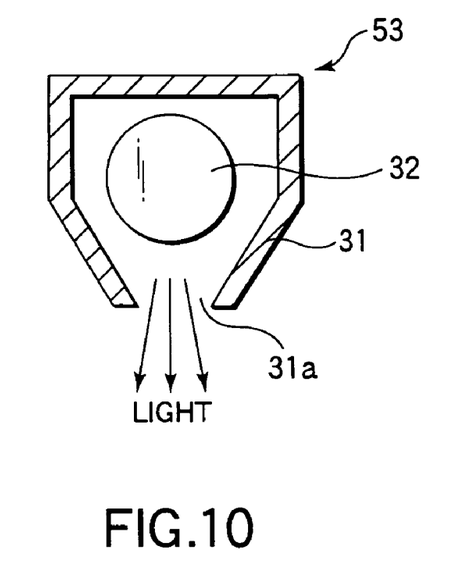
[FIG. 10] This is a sectional view schematically showing a light radiation and scan device.

The developing unit (DEV) may be preferably modified as in a developing unit (DEV)' shown in the plan view of FIG. 9. This developing unit (DEV)' includes a light radiation and scan device 53 having an elongated shape in place of the light radiation device 51. FIG. 10 is a sectional view schematically showing the light radiation and scan device 53, perpendicularly to the longitudinal direction. The light radiation and scan device 53 includes a casing 31 having a slit 31a to radiate light essentially as a strip extending in the longitudinal direction, and a rod-like light source 32, such as an ultraviolet ray emitting tube, disposed in the casing 31. As in the developing solution nozzle 86, the light radiation and scan device 53 is movable for scanning in the Y direction and is also movable up and down.

Where the developing unit (DEV)' including the light radiation and scan device 53 is used to perform the first processing method described with reference to the developing unit (DEV), it is operated as follows. Specifically, the developing solution nozzle 86 is moved for scanning in the +Y direction above a wafer W, while delivering the developing solution. Further, the chemical liquid nozzle 81 is also moved for scanning in the +Y direction in chase of the developing solution nozzle 86 to supply the curing chemical liquid onto that portion of the wafer W which has been supplied with the developing solution. Furthermore, the light radiation and scan device 53 is also moved for scanning in the +Y direction in chase of the chemical liquid nozzle 81 to radiate ultraviolet rays onto that portion of the surface of the wafer W which has been supplied with the curing chemical liquid. This scanning of the developing solution nozzle 86, chemical liquid nozzle 81, and light radiation and scan device 53 may be repeated a plurality of times.

Figure 11:
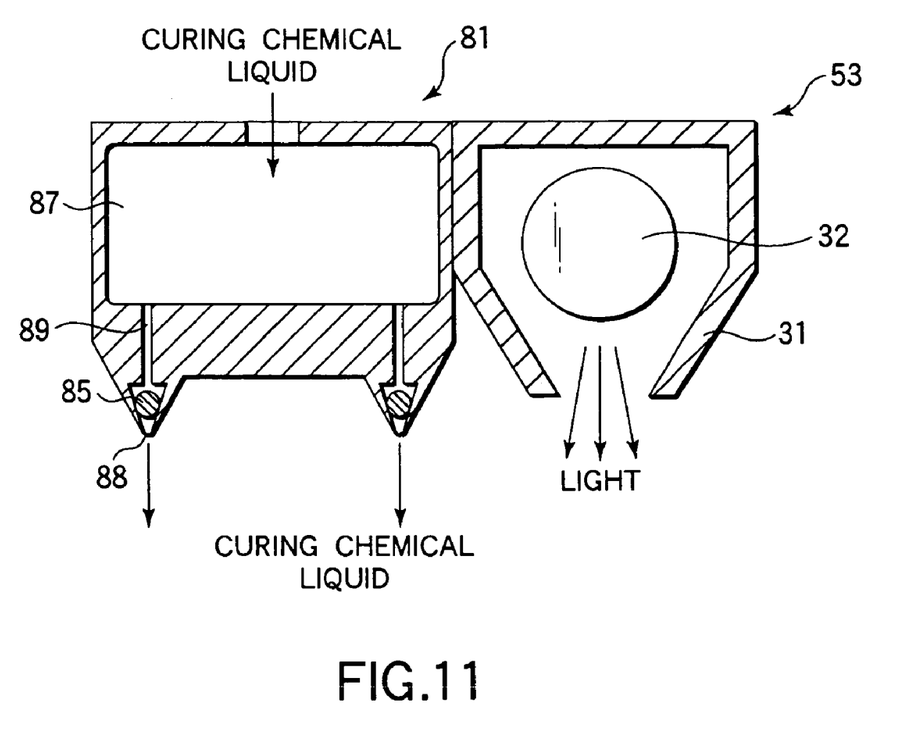
[FIG. 11] This is a sectional view showing a nozzle structure in which a chemical liquid nozzle is integrated with a light radiation and scan device.

As shown in the sectional view of FIG. 11, the developing unit (DEV)' may be arranged such that the chemical liquid nozzle 81 is integrated with the light radiation and scan device 53 with their longitudinal directions set in parallel with each other. Further, as shown in the sectional view of FIG. 12, the combination of the chemical liquid nozzle 81 and light radiation and scan device 53 thus integrated may be further integrated with the developing solution nozzle 86. Further, in an explanation described above, the developing solution nozzle 86, chemical liquid nozzle 81, rinsing nozzle 95, light radiation and scan device 53 are moved for scanning above the wafer W, but this arrangement is not limiting. For example, a mechanism for horizontally moving the wafer W may be used for relative movement between the wafer W and the developing solution nozzle 86, chemical liquid nozzle 81, rinsing nozzle 95, and light radiation and scan device 53.

Figure 13:
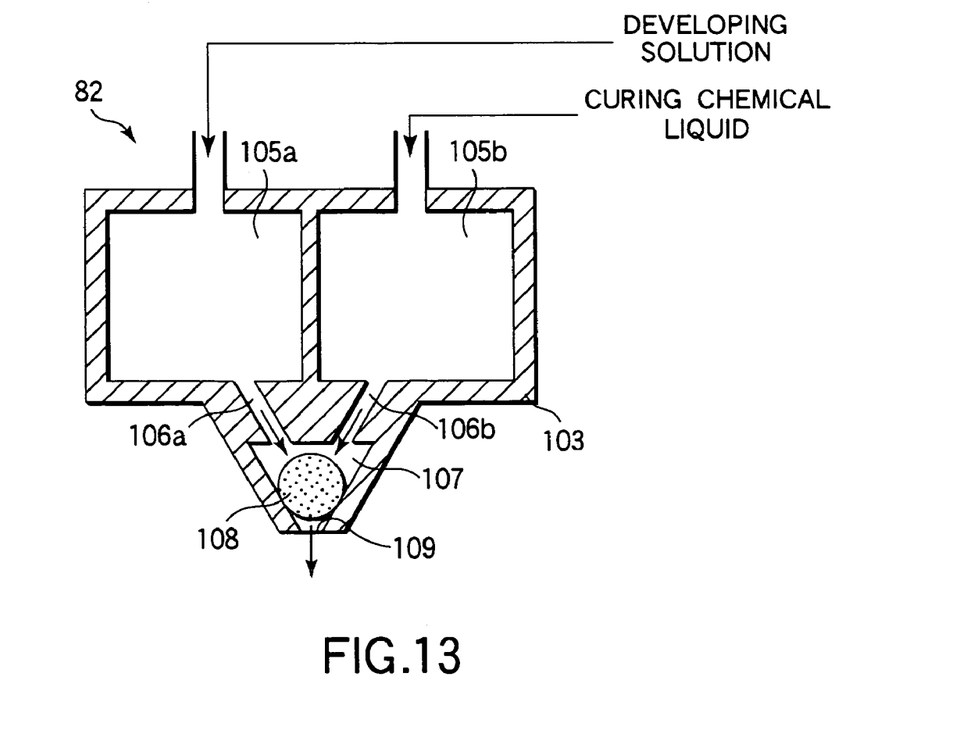
[FIG. 13] This is a sectional view schematically showing a developing solution/chemical liquid nozzle. p [FIG. 14] This is a sectional view schematically showing a rinsing liquid/chemical liquid nozzle.

Next, an explanation will be given of other nozzle arrangements useable in the developing units (DEV) and (DEV)'. FIG. 13 is a sectional view schematically showing a developing solution/chemical liquid nozzle 82, which can deliver the developing solution and curing chemical liquid while mixing them at an arbitrary ratio. As in the developing solution nozzle 86 described above, the developing solution/chemical liquid nozzle 82 has an elongated shape and is disposed such that the longitudinal direction (direction perpendicular to the sheet surface of FIG. 13) of the elongated shape is horizontal. The developing solution/chemical liquid nozzle 82 includes a tube body 103, in which a first liquid reservoir cell 105a and a second liquid reservoir cell 105b are formed independently of each other. The first liquid reservoir cell 105a is supplied with the developing solution, and the second liquid reservoir cell 105b is supplied with the curing chemical liquid.

The tube body 103 includes a liquid mixing cell 107 formed below the first liquid reservoir cell 105a and second liquid reservoir cell 105 and having a slit-like discharge port 109 at the lower end. The first liquid reservoir cell 105a communicates with the liquid mixing cell 107 through a first communication channel 106a. The second liquid reservoir cell 105b communicates with the liquid mixing cell 107 through a second communication channel 106b. The developing solution/chemical liquid nozzle 82 having this structure mixes the developing solution and curing chemical liquid in the liquid mixing cell 107 at a predetermined ratio, and then delivers the mixture liquid thus adjusted in composition from the slit-like discharge port 109. Further, the developing solution/chemical liquid nozzle 82 can discharge either one of the developing solution and curing chemical liquid from the slit-like discharge port 109 through the liquid mixing cell 107. In other words, the liquid mixing cell 107 can be used as a mere passage for the developing solution or curing chemical liquid.

The liquid mixing cell 107 is preferably provided with a buffer rod 108. This buffer rod 108 causes the state of the developing solution and/or curing chemical liquid discharged from the slit-like discharge port 109 to be uniform in the longitudinal direction of the developing solution/chemical liquid nozzle 82. Further, the buffer rod 108 can prevent the developing solution and/or curing chemical liquid from leaking from the slit-like discharge port 109. The buffer rod 108 also has the function of uniformly mixing the developing solution and curing chemical liquid flowing from the first liquid reservoir cell 105a and second liquid reservoir cell 105b.

In each of the developing unit (DEV) having the light radiation device 51 and the developing unit (DEV)' having the light radiation and scan device 53, if the existing chemical liquid nozzle 81 and developing solution nozzle 86 are replaced with the developing solution/chemical liquid nozzle 82, only the rinsing nozzle 95 is additionally disposed as another nozzle. Where a developing unit thus arranged is used to perform a developing process on a wafer W having a light-exposed resist film, the following method may be performed. Specifically, the developing solution and curing chemical liquid are mixed at a predetermined ratio, and this mixture liquid is supplied onto the wafer W. Then, ultraviolet rays are radiated from the light radiation device 51 or light radiation and scan device 53 onto the surface of the wafer W. Consequently, a developing reaction of the resist film and a curing process of the remaining resist pattern are concurrently performed.

Figure 14:
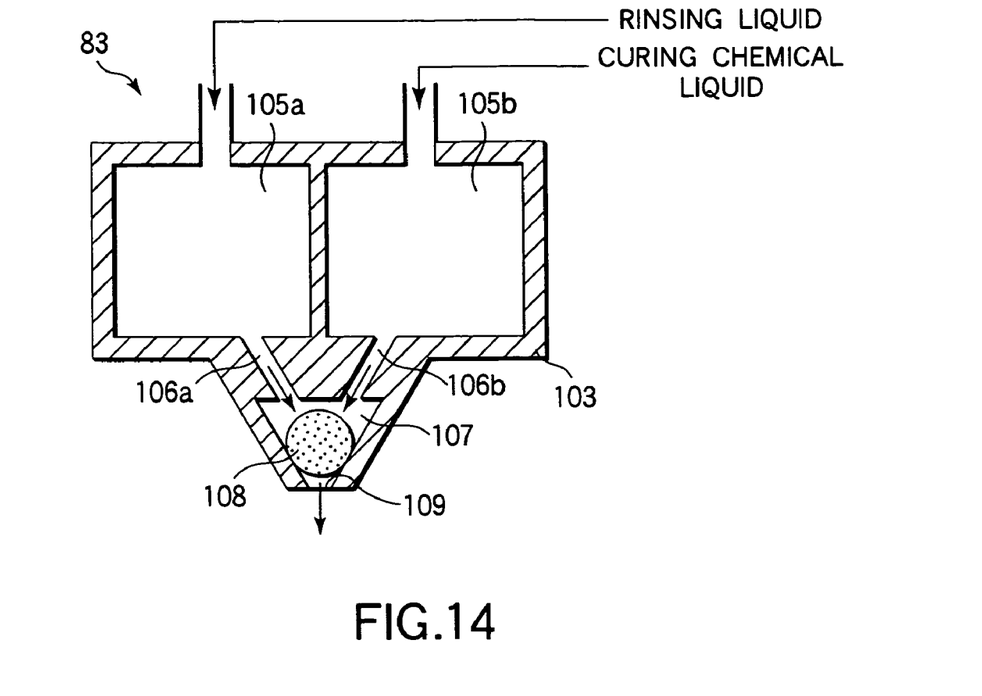

The developing solution/chemical liquid nozzle 82 can be changed to a structure in which purified water is supplied into the first liquid reservoir cell 105a, so that it is modified to a rinsing liquid/chemical liquid nozzle 83, as shown in the sectional view of FIG. 14. The rinsing liquid/chemical liquid nozzle 83 can discharge only the rinsing liquid, only the curing chemical liquid, or a mixture liquid prepared by mixing the rinsing liquid and curing chemical liquid at an arbitrary ratio.

In each of the developing unit (DEV) having the light radiation device 51 and the developing unit (DEV)' having the light radiation and scan device 53, if the existing chemical liquid nozzle 81 and rinsing nozzle 95 are replaced with the rinsing liquid/chemical liquid nozzle 83, only the developing solution nozzle 86 is additionally disposed as another nozzle. Where a developing unit thus arranged is used to perform a developing process on a wafer W having a light-exposed resist film, the following method may be performed. Specifically, the developing solution is supplied from the developing solution nozzle 86 onto the surface of the wafer W to develop the resist film. Then, for a rinsing process, the curing chemical liquid and rinsing liquid are mixed at a predetermined ratio in the rinsing liquid/chemical liquid nozzle 83, and this mixture liquid is supplied onto the wafer W. Then, ultraviolet rays are radiated from the light radiation device 51 or light radiation and scan device 53 onto the surface of the wafer W to cure the remaining resist pattern. Then, only the rinsing liquid is supplied from the rinsing liquid/chemical liquid nozzle 83 onto the wafer W to wash out the curing chemical liquid from the wafer W.

Figure 15:
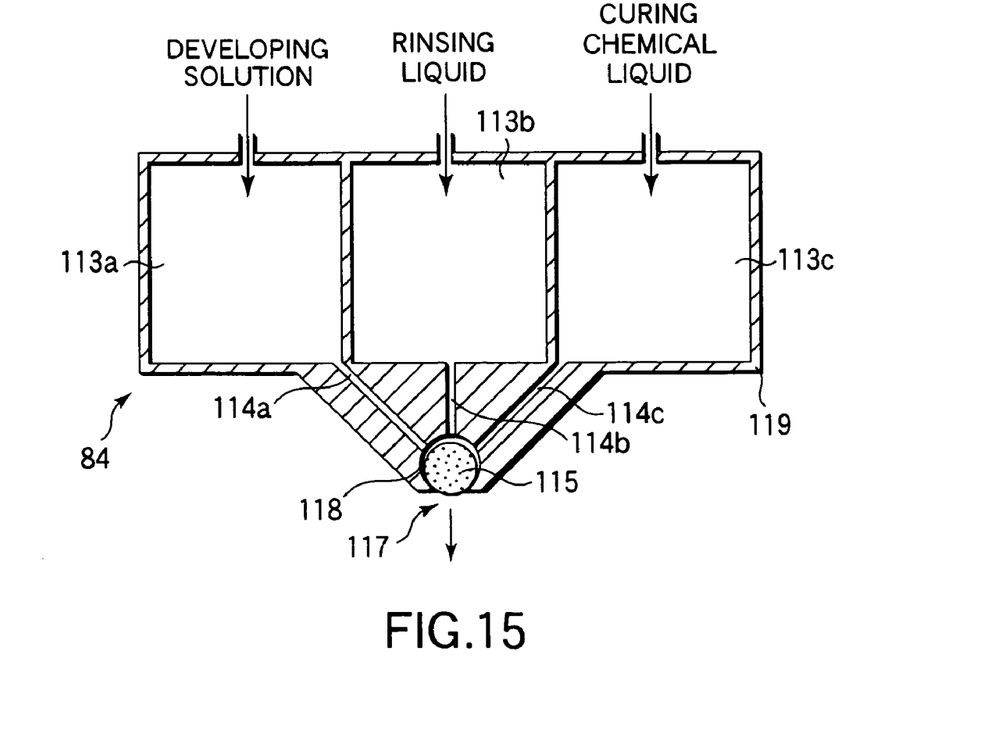
[FIG. 15] This is a sectional view schematically showing a process liquid nozzle.

In each of the developing unit (DEV) and developing unit (DEV)', the existing developing solution nozzle 86 may be replaced with a process liquid nozzle 84 shown in the sectional view of FIG. 15. This process liquid nozzle 84 is arranged to discharge only one of the three liquids, i.e., the developing solution, rinsing liquid, and curing chemical liquid, or two of the three liquids mixed at an arbitrary ratio, or all of the three liquids mixed at an arbitrary ratio. As in the developing solution nozzle 86, the process liquid nozzle 84 has an elongated shape and is disposed such that the longitudinal direction (direction perpendicular to the sheet surface of FIG. 15) of the elongated shape is horizontal. The process liquid nozzle 84 includes a tube body 119, in which a developing solution reservoir cell 113a, a rinsing liquid reservoir cell 113b, and a chemical liquid reservoir cell 113c are formed independently of each other. The developing solution reservoir cell 113a is supplied with the developing solution, the rinsing liquid reservoir cell 113b is supplied with the purified water, and the chemical liquid reservoir cell 113c is supplied with the curing chemical liquid.

The tube body 119 includes a liquid mixing cell 118 formed below the reservoir cells 113a to 113c and communicating with the reservoir cells 113a, 113b, and 113c through communication channels 114a, 114b, and 114c, respectively. The liquid mixing cell 118 has a slit-like discharge port 117 at the lower end, and is provided with a buffer rod 115 placed therein. This buffer rod 115 causes the state of the developing solution and so forth delivered from the slit-like discharge port 117 to be uniform in the longitudinal direction. Further, the buffer rod 115 can prevent the developing solution and so forth from leaking from the slit-like discharge port 117.

Where the process liquid nozzle 84 is used to perform a developing process on a wafer W having a light-exposed resist film, the following method may be performed. Specifically, the developing solution and curing chemical liquid are mixed at a predetermined ratio, and this mixture liquid is supplied from the process liquid nozzle 84 onto the wafer W. Then, ultraviolet rays are radiated from the light radiation device 51 or light radiation and scan device 53 onto the surface of the wafer W to perform a curing process of the remaining resist pattern. Then, the curing chemical liquid and rinsing liquid are mixed at a predetermined ratio, and this mixture liquid is supplied from the process liquid nozzle 84 onto the wafer W. Further, ultraviolet rays are radiated from the light radiation device 51 or light radiation and scan device 53 onto the surface of the wafer W to perform a curing process of the remaining resist pattern. At the end, only the rinsing liquid is supplied from the process liquid nozzle 84 onto the wafer W to wash out the curing chemical liquid from the wafer W, and further a spin drying operation is performed.

The present invention has been described with reference to the embodiments, but the present invention is not limited to these embodiments. For example, the high energy rays for curing the remaining resist pattern are not limited to ultraviolet rays. Suitable energy rays may be selected from infrared rays, microwaves, heat rays, and electron rays, in accordance with the curing performance of a resist in use. In other words, infrared rays, microwaves, heat rays, or electron rays may be used to increase the temperature of the curing chemical liquid, so as to promote a curing process of the remaining resist pattern.

Figure 12:
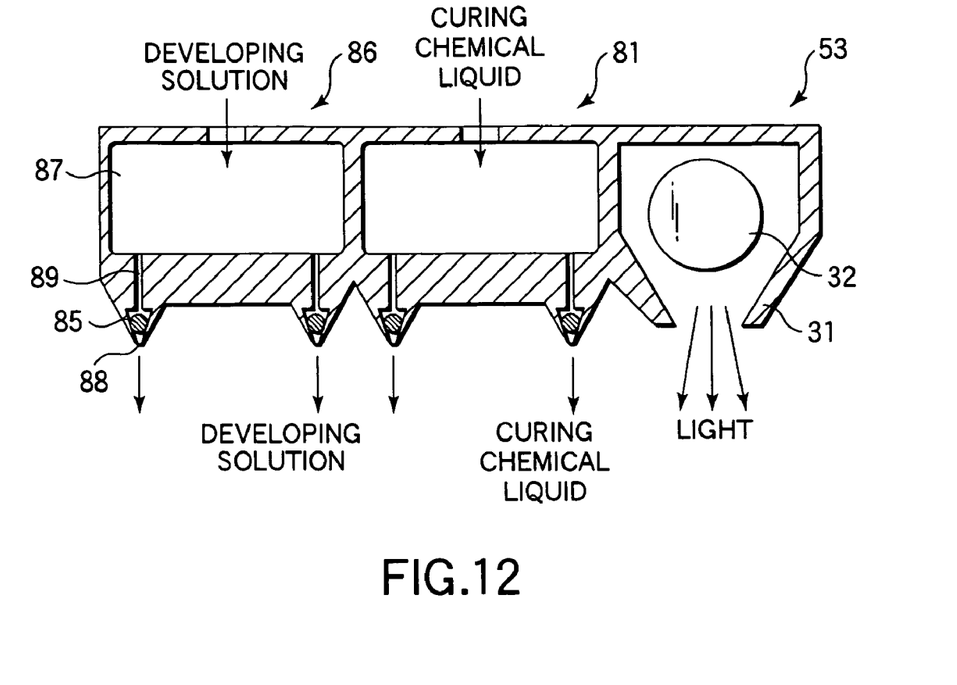
[FIG. 12] This is a sectional view showing a nozzle structure in which a developing solution nozzle and a chemical liquid nozzle are integrated with a light radiation and scan device.

The developing solution/chemical liquid nozzle 82, rinsing liquid/chemical liquid nozzle 83, or process liquid nozzle 84 may be integrated with the light radiation and scan device 53, as in the structure shown in FIG. 11 in which the chemical liquid nozzle 81 is integrated with light radiation and scan device 53, or the structure shown in shown in FIG. 12 in which the developing solution nozzle 86 and chemical liquid nozzle 81 are integrated with the light radiation and scan device 53. According to this nozzle structure, the nozzle driving control can be simplified.

Further, the high energy radiation mechanism of ultraviolet rays or the like may be structured such that it radiates ultraviolet rays at a spot, or it rotate ultraviolet rays while describing an arc between the center and peripheral edge of a wafer W. The rinsing nozzle may be also structured to perform the same movement.

The embodiments described above are intended only to clarify the technical content of the present invention, and, therefore, the present invention should not be construed as being limited to the embodiments. Various modifications may be made without departing from the spirit of the present invention or the scope of the appended claims.

INDUSTRIAL APPLICABILITY

The developing method and developing apparatus according to the present invention can be suitably applied to manufacturing of semiconductor devices and manufacturing of flat panel displays.

The invention claimed is:

1. A developing apparatus comprising:
a rotatable spin chuck configured to hold a substrate having a light-exposed resist film disposed thereon;
a developing solution nozzle configured to supply a predetermined developing solution for developing the resist film onto a surface of the substrate held by the spin chuck;
a rinsing nozzle configured to supply a rinsing liquid onto a surface of the substrate held by the spin chuck;
a chemical liquid nozzle configured to supply a chemical liquid onto a surface of the substrate held by the spin chuck, wherein the chemical liquid contains a resist curing aid contributory to curing of a resist film remaining on the substrate after a developing reaction;
a shifting mechanism configured to move the developing solution nozzle, the rinsing nozzle, and the chemical liquid nozzle relative to the substrate held by the spin chuck; and
a light radiation mechanism configured to radiate light having a predetermined wavelength onto a surface of the substrate held by the spin chuck, wherein
the developing solution nozzle has a structure elongated in one direction and configured to deliver the developing solution essentially as a strip extending in a longitudinal direction thereof,
the chemical liquid nozzle has a structure elongated in one direction and configured to discharge the chemical liquid essentially as a strip extending in a longitudinal direction thereof,
the developing solution nozzle and the chemical liquid nozzle are integrated in parallel with each other,
the light radiation mechanism comprises a casing elongated in one direction and having a slit to radiate light essentially as a strip extending in a longitudinal direction thereof, and a light source of a predetermined wavelength disposed in the casing, and
the casing and the chemical liquid nozzle are integrated in parallel with each other.

2. The developing apparatus according to claim 1, wherein the rinsing nozzle has a structure elongated in one direction and configured to discharge the rinsing liquid essentially as a strip extending in a longitudinal direction thereof, and
the rinsing nozzle and the chemical liquid nozzle are integrated in parallel with each other.

3. A developing apparatus comprising:
a rotatable spin chuck configured to hold a substrate having a light-exposed resist film disposed thereon;
a developing solution nozzle configured to supply a predetermined developing solution for developing the resist film onto a surface of the substrate held by the spin chuck;
a rinsing nozzle configured to supply a rinsing liquid onto a surface of the substrate held by the spin chuck;
a chemical liquid nozzle configured to supply a chemical liquid onto a surface of the substrate held by the spin chuck, wherein the chemical liquid contains a resist curing aid contributory to curing of a resist film remaining on the substrate after a developing reaction;
a shifting mechanism configured to move the developing solution nozzle, the rinsing nozzle, and the chemical liquid nozzle relative to the substrate held by the spin chuck; and
a light radiation mechanism configured to radiate light having a predetermined wavelength onto a surface of the substrate held by the spin chuck;
wherein the chemical liquid nozzle comprises a casing elongated in one direction, which has a chemical liquid cell to store the chemical liquid therein, and a discharge port to discharge the chemical liquid essentially as a strip extending in a longitudinal direction thereof from the chemical liquid cell,
the light radiation mechanism comprises a casing elongated in one direction and having a slit to radiate light essentially as a strip extending in a longitudinal direction thereof, and a light source of a predetermined wavelength disposed in the casing, and
the casing of the chemical liquid nozzle and the casing of the light radiation mechanism are integrated in parallel with each other.

4. A developing apparatus comprising:
a rotatable spin chuck configured to hold a substrate having a light-exposed resist film disposed thereon;
a developing solution nozzle configured to supply a predetermined developing solution for developing the resist film onto a surface of the substrate held by the spin chuck;
a rinsing nozzle configured to supply a rinsing liquid onto a surface of the substrate held by the spin chuck;
a chemical liquid nozzle configured to supply a chemical liquid onto a surface of the substrate held by the spin chuck, wherein the chemical liquid contains a resist curing aid contributory to curing of a resist film remaining on the substrate after a developing reaction;
a shifting mechanism configured to move the developing solution nozzle, the rinsing nozzle, and the chemical liquid nozzle relative to the substrate held by the spin chuck; and
a light radiation mechanism configured to radiate light having a predetermined wavelength onto a surface of the substrate held by the spin chuck, wherein
the rinsing nozzle has a structure elongated in one direction and configured to discharge the rinsing liquid essentially as a strip extending in a longitudinal direction thereof,
the chemical liquid nozzle has a structure elongated in one direction and configured to discharge the chemical liquid essentially as a strip extending in a longitudinal direction thereof,
the rinsing nozzle and the chemical liquid nozzle are integrated in parallel with each other,
the light radiation mechanism comprises a casing elongated in one direction and having a slit to radiate light essentially as a strip extending in a longitudinal direction thereof, and a light source of a predetermined wavelength disposed in the casing, and
the casing and the chemical liquid nozzle are integrated in parallel with each other.

5. The developing apparatus according to claim 3, wherein the developing solution nozzel has a structure elongated in one direction and configured to deliver the developing solution essentially as a strip extending in a longitidinal direction thereof, and
the developing solution nozzle and the chemical liquid nozzle are integrated in parallel with each other.

* * * * *